(12) United States Patent
Shin et al.

(10) Patent No.: US 12,470,192 B2
(45) Date of Patent: Nov. 11, 2025

(54) RECONFIGURABLE FILTERS IN MULTIPLEXER

(71) Applicant: Avago Technologies International Sales Pte. Limited, Singapore (SG)

(72) Inventors: JeaShik Shin, Hwaseong-si (KR); Hyeonhyeong Choe, Seoul (KR); Jeesu Kim, San Ramon, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 205 days.

(21) Appl. No.: 18/498,004

(22) Filed: Oct. 30, 2023

(65) Prior Publication Data
US 2025/0141421 A1 May 1, 2025

(51) Int. Cl.
*H03H 7/01* (2006.01)
*H03H 9/02* (2006.01)

(52) U.S. Cl.
CPC ...... *H03H 7/0161* (2013.01); *H03H 9/02015* (2013.01)

(58) Field of Classification Search
CPC ........ H03H 9/542; H03H 9/605; H03H 9/568; H03H 7/0161; H03H 9/706; H03H 7/38; H03H 9/205; H03H 9/02007; H03H 9/54; H03H 9/547; H03H 9/6409; H03H 7/0115; H03H 9/6483; H03H 9/74; H03H 9/72; H03H 9/725; H03H 7/075; H03H 7/46; H03H 9/02086; H03H 9/703; H03H 9/02818; H03F 3/191; H03F 3/602; H03F 3/60
See application file for complete search history.

(56) References Cited

U.S. PATENT DOCUMENTS 8,554,081 B2 10/2013 Kovsh et al.
10,243,538 B2 * 3/2019 Kato ................ H03F 1/565

FOREIGN PATENT DOCUMENTS

AU 2021101594 A4 5/2021

OTHER PUBLICATIONS

Kalidindi et al., "Implementation of efficient reconfigurable FIR filter with control logic for 5G applications," Jun. 30, 2021, 10 pages.
Yang et al, "Fully printed VO2switch based flexible and reconfigurable filter," Jul. 4, 2023, 4 pages.
(Continued)

*Primary Examiner* — Lincoln D Donovan
*Assistant Examiner* — Tyler J Pereny
(74) *Attorney, Agent, or Firm* — Quarles & Brady LLP

(57) ABSTRACT

A filter device for multi-band wireless communication includes a first circuit characterized by a first pass-band from a first frequency to a second frequency; a second circuit characterized by a second pass-band from a frequency no smaller than the first frequency to a third frequency, the third frequency being no higher than the second frequency but higher than the first frequency; a third circuit characterized by a third pass-band from a fourth frequency to a frequency no greater than the second frequency, the fourth frequency being no smaller than the first frequency but smaller than the second frequency; and a switch configured to connect the first circuit either to the second circuit to reconfigure a first filter with the second pass-band or to the third circuit to reconfigure a second filter with the third pass-band.

20 Claims, 7 Drawing Sheets

(56) References Cited

OTHER PUBLICATIONS

Zhang et al, "Compact reconfigurable bandpass filter with wide frequency tuning range," Feb. 11, 2019, 11 pages.
Huang et al, "Acousto-optic reconfigurable filter based on vector mode fusion in dispersion-compensating fiber," Jun. 8, 2023, 11 pages.
Chen et al, "An Efficient Micro Control Unit with a Reconfigurable Filter Design for Wireless Body Sensor Networks (WBSNs)," Nov. 22, 2012, 17 pages.
Lee et al., "Reconfigurable Filter Design," Aug. 2, 2021, 20 pages.

* cited by examiner

RECONFIGURABLE FILTERS IN MULTIPLEXER

FIELD OF INVENTION

The subject technology is directed to devices in wireless communication.

BACKGROUND OF THE INVENTION

In a multi-mode and multi-band wireless communication system, filters play an many roles within the multiplexer structure, ensuring that signals across different frequency bands are isolated from each other and correctly directed. These filters help in separating, combining, or routing different frequency bands to appropriate paths, facilitating a seamless operation between various communication standards (e.g., LTE, 5G, Wi-Fi, etc.) and across diverse frequency bands (e.g., 2.4 GHz, 5 GHZ, etc.). A multiplexer can be made to support various frequency bands simultaneously. For example, a smartphone might need to operate across multiple LTE bands, Wi-Fi bands, and possibly other specialized communication bands. In such cases, the multiplexer contains an array of filters, each tuned to the specific frequency bands that the device needs to support. Normally each filter that transmits or receives the required signal and blocks the undesired ones is designed to support only one band. As every band needs its respective filter, the number of filters needed for multiplexer is very large and the matching network components needed for matching between filter and RFIC make the module very complicated. The module size is increased to support as many bands as needed. Therefore, an improved filter device is desired, that can support multi-bands by itself so that the numbers of filters needed in the multiplexer module and associated matching networks can be reduced.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
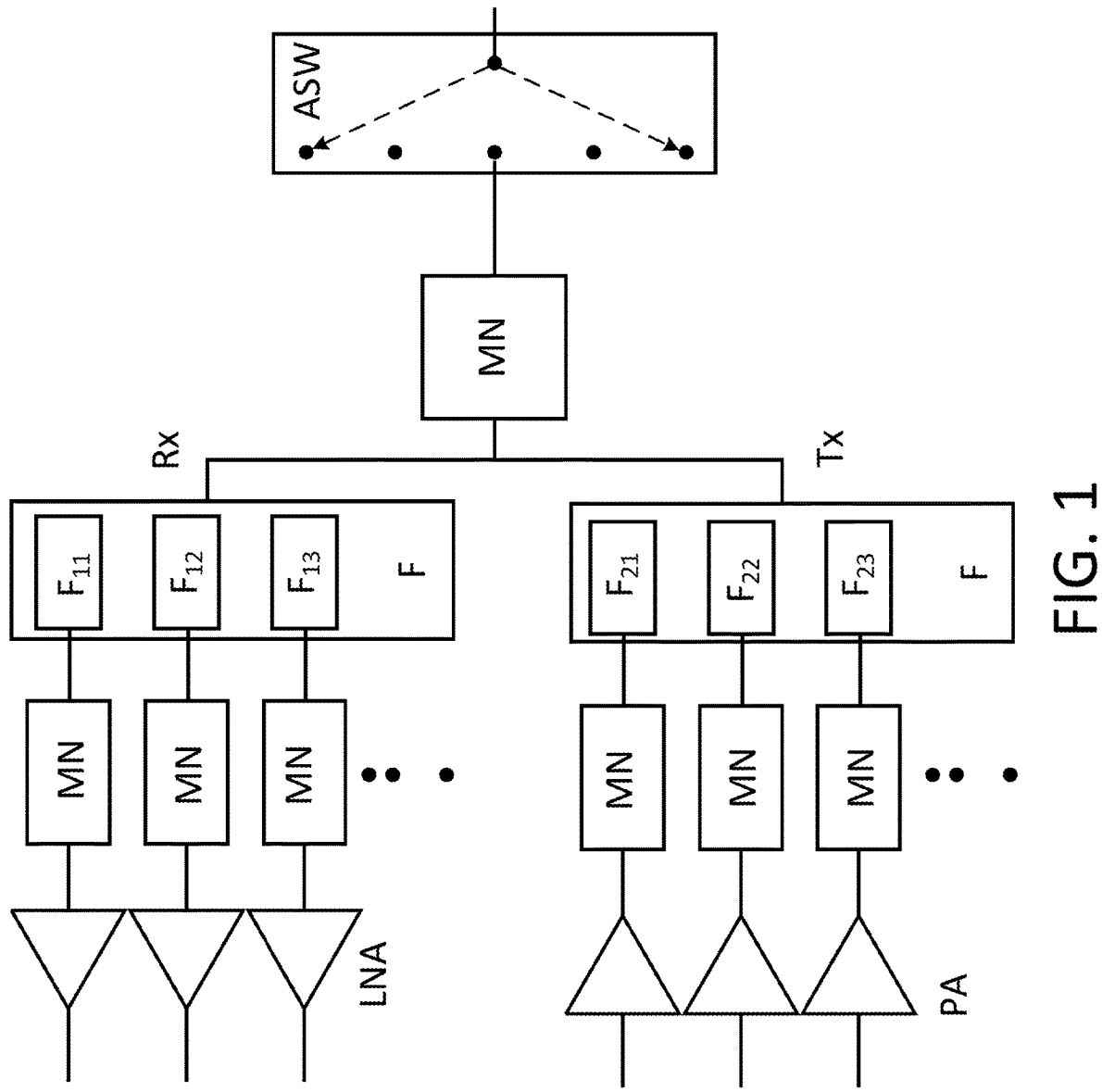
FIG. 1 is a simplified block diagram of a conventional multiplexer structure for supporting multi-mode and multi-band wireless communication system.

The subject technology provides a filter device for multi-band wireless communication. In an embodiment, the device includes a first circuit characterized by a first pass-band from a first frequency to a second frequency. The device also includes a second circuit characterized by a second pass-band from the first frequency to a third frequency. The device also includes a third circuit characterized by a third pass-band from a fourth frequency to the second frequency. The device further includes a switch configured to either connect the first circuit to the second circuit to reconfigure a filter with the second pass-band or connect the first circuit to the third circuit to reconfigure another filter with the third pass-band. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect of the subject technology includes a filter device for multi-band wireless communication. The filter device also includes a first circuit characterized by a first pass-band from a first frequency to a second frequency, the second frequency being greater than the first frequency. The device also includes a second circuit characterized by a second pass-band from a frequency no smaller than the first frequency to a third frequency, the third frequency being no higher than the second frequency but higher than the first frequency. The device also includes a third circuit characterized by a third pass-band from a fourth frequency to a frequency no greater than the second frequency, the fourth frequency being no smaller than the first frequency but smaller than the second frequency. The device also includes a switch being configured to connect the first circuit either to the second circuit to reconfigure a first filter with the second pass-band or to the third circuit to reconfigure a second filter with the third pass-band, where at least one of the second pass-band and the third pass-band is narrower than the first pass-band.

Implementations may include one or more of the following features. The device where the first circuit may include a first rejection-band below a fifth frequency and a second rejection-band above a sixth frequency, the fifth frequency being smaller than the first frequency, the sixth frequency being higher than the second frequency. The first filter may include a third rejection-band below a seventh frequency and a fourth rejection-band above an eighth frequency, the seventh frequency being aligned with the fifth frequency, the eighth frequency being greater than the third frequency but smaller than the sixth frequency. The first circuit may include a plurality of first resonators coupled in series in a transmission line and a plurality of second resonators coupled in parallel with the transmission line, each first resonator being characterized by a respective anti-resonance frequency associated with the sixth frequency, each second resonator being characterized by a respective resonance frequency associated with the fifth frequency. Each of the first resonator and the second resonator may include a film bulk acoustic resonator (FBAR). The second circuit may include a plurality of third resonators coupled in series in a transmission line and a plurality of fourth resonators coupled in parallel with the transmission line, each third resonator being characterized by a respective anti-resonance frequency associated with the eighth frequency, each fourth resonator being characterized by a respective resonance frequency associated with the seventh frequency, each of the third resonator and the fourth resonator may include a film bulk acoustic resonator (FBAR). The third rejection band may include at least 40 dB loss for frequencies smaller than the seventh frequency, attributed to an aggregation of each peak impedance contribution from each fourth resonator and second resonator at the respective resonance frequency with the seventh frequency being aligned to the fifth frequency. The fourth rejection-band may include at least 40 dB loss for frequencies greater than the eighth frequency, attributed to an aggregation of each peak impedance contribution from each third resonator and first resonator at the respective anti-resonance frequency. The first filter may include a fourth pass-band from an eleventh frequency to a twelfth frequency, a seventh rejection-band below a thirteenth frequency, and an eighth rejection-band above a fourteenth frequency, the eleventh frequency being higher than the first frequency, the twelfth frequency being lower than the second frequency, the thirteenth frequency being higher than the fifth frequency but the seventh rejection-band being deeper in rejection than the first rejection-band, the fourteenth frequency being lower than the sixth frequency but the eighth rejection-band being deeper in rejection than the second rejection-band. The second filter may include a fifth rejection-band below a ninth frequency and a sixth rejection-band above a tenth frequency, the ninth frequency being smaller than the fourth frequency but greater than the fifth frequency, the tenth frequency being aligned with the sixth frequency. The third circuit may include a plurality of fifth resonators coupled in series in a transmission line and a plurality of sixth resonators coupled in parallel with the transmission line, each fifth resonator being characterized by a respective anti-resonance frequency associated with the tenth frequency, each sixth resonator being characterized by a respective resonance frequency associated with the ninth frequency, each of the fifth resonator and the sixth resonator may include a film bulk acoustic resonator (FBAR). The fifth rejection-band may include at least 40 dB loss for frequencies smaller than the ninth frequency, attributed to an aggregation of each peak impedance contribution from each sixth resonator and second resonator at the respective resonance frequency. The sixth rejection-band may include at least 40 dB loss for frequencies greater than the tenth frequency, attributed to an aggregation of each peak impedance distribution of each fifth resonator and first resonator at the respective anti-resonance frequency with the tenth frequency being aligned to the sixth frequency.

Another general aspect of the subject technology includes a reconfigurable filter device for multi-mode and multi-band wireless communication systems. The reconfigurable filter device also includes a first circuit characterized by a first pass-band from a first frequency to a second frequency, the second frequency being higher than the first frequency. The device also includes a second circuit characterized by a second pass-band from a frequency no smaller than the first frequency to a third frequency, the third frequency being no higher than the second frequency but higher than the first frequency. The device also includes a third circuit characterized by a third pass-band from a fourth frequency to a frequency no greater than the second frequency, the fourth frequency being no lower than the first frequency but lower than the second frequency. The device also includes a switch may include an input port coupled to the first circuit, a first output coupled to the second circuit, and a second output port coupled to the third circuit, the switch being configured to receive a first signal filtered with the first pass-band through the first circuit at the input port and deliver to the first output port for reconfiguring a second signal filtered with the second pass-band through the second circuit, or directly to the second output port for reconfiguring a third signal filtered with the third pass-band through the third circuit. The device also includes a fourth circuit coupled in parallel to the switch between the first circuit and the second circuit or the third circuit and configured to enforce rejection-bands for the second signal or the third signal.

Implementations may include one or more of the following features. The device where the first circuit may include a plurality of first resonators coupled in series in a transmission line and a plurality of second resonators coupled in parallel with the transmission line, the plurality of second resonators resulting in a first rejection-band below a fifth frequency, the plurality of first resonators resulting in a second rejection-band above a sixth frequency, the fifth frequency being lower than the first frequency, the sixth frequency being higher than the second frequency. The second circuit may include a plurality of third resonators coupled in series in a transmission line and a plurality of fourth resonators coupled in parallel with the transmission line, the second circuit combined with the first circuit producing a first filter with the second pass-band, the plurality of fourth resonators and the plurality of second resonators providing the first filter with a third rejection-band with higher loss than the first rejection-band below a seventh frequency, the plurality of third resonators and the plurality of first resonators providing the first filter with a fourth rejection-band with higher loss than the second rejection-band above an eighth frequency, the seventh frequency being aligned with the fifth frequency, the eighth frequency being higher than the third frequency. The third circuit may include a plurality of fifth resonators coupled in series in a transmission line and a plurality of sixth resonators coupled in parallel with the transmission line, the third circuit combined with the first circuit producing a second filter with the third pass-band, the plurality of sixth resonators and the plurality of second resonators providing the second filter with a fifth rejection-band with higher loss than the first rejection band below a ninth frequency, the plurality of fifth resonators and the plurality of first resonators providing the second filter with a sixth rejection-band with higher loss than the second rejection-band above a tenth frequency, the ninth frequency being lower than the fourth frequency, the tenth frequency being aligned with the sixth frequency. The fourth circuit may include a capacitor, or an inductor, or a resonator configured to reconfigure the first or second filter with increased rejection loss by shifting the anti-resonance frequency of one of the first resonators in the first circuit. The first filter is alternatively characterized by a fourth pass-band that is configured to be narrower than and within the first pass-band, a seventh rejection-band below an eleventh frequency that is higher than the fifth frequency, and an eighth rejection-band above twelfth frequency that is lower than the sixth frequency, the seventh rejection-band being deeper in rejection than the first rejection-band, the eighth rejection-band being deeper in rejection than the second rejection-band.

Yet another general aspect of the subject technology includes a reconfigurable filter device. The reconfigurable filter device also includes a circuit may include a first plurality of resonators in series and shunt circuitry characterized by a first pass-band from a first frequency to a second frequency, a second plurality of resonators in series and shunt circuitry characterized by a second pass-band from a frequency no smaller than the first frequency to a third frequency, a third plurality of resonators in series and shunt circuitry characterized by a third pass-band from a fourth frequency to a frequency no greater than the second frequency, and a capacitor coupled between the first plurality of resonators and the second plurality of resonators, the third frequency being lower than the second frequency but higher than the first frequency, the fourth frequency being higher than the first frequency but lower than the second frequency. The device also includes a switch configured to couple to the circuit to either connect the first plurality of resonators to the second plurality of resonators to reconfigure a first filter with the second pass-band and deeper rejection-bands or connect the first plurality of resonators to the third plurality of resonators to reconfigure a second filter with the third pass-band and deeper rejection-bands.

FIG. 1 is a simplified block diagram of a conventional multiplexer structure for supporting multi-mode and multi-band wireless communication system. In a multi-mode and multi-band wireless communication system, the multiplexer structure includes an Antenna Switching module (ASW) to support multi-band network-connected wireless devices by combining the individual transmission and receiving paths of individual frequency bands emitted by one or more antennas of Long-Term Evolution (LTE), Code-Division Multiple Access (CDMA), Universal Mobile Telecommunications Service (UMTS), Enhanced Data rates for GSM Evolution (EDGE) and Global System for Mobile Communications (GSM). In particular, ASW allows multi-band operations to share one antenna. These modules can be used for both transmission and reception of RF signals. Using Rx path as an example, a matching network (MN) is firstly disposed with properly matching impedance with the input impedance of the signals associated with the particular communication, e.g., LTE, to maximize power transfer and reduce possible signal power loss. Multiplexer filters F allow for the simultaneous handling of multiple frequency bands. They perform the functions of filtering out unwanted frequencies while allowing desired bands to pass through. Each of these filters handles a particular working bandwidth. For example, filter $F_{11}$ has a pass-band from 2300 MHz to 2400 MHZ, and a rejection-band from 2427 to 2482 MHz. Filter $F_{12}$ may have another pass-band from 2300 to 2370 MHz, and a rejection-band from 2402 to 2482 MHz. After passing these filters, another matching network (MN) is needed for each signal coming out of the filters to ensure that the signals are received with minimal loss. Finally, a low-noise amplifier (LNA) may be needed to enhance signal-to-noise ratio for any further downstream signal processing. Similar configurations are implemented for Tx path of the multiplexer module where a power amplifier (PA) may be needed for each band to amplify the signals before they are sent to the antenna for transmission.

As every band needs its respective filter, the number of filters needed for multiplexer can be very large. The same large number of matching components are needed for matching between the filters and associated RF components like (LNA or PA) amplifier devices, making the multiplexer module more complicated and increasing module size to support as many bands as needed. Reconfigurable filters which can reconfigure their frequency of pass-band and rejection-band can reduce the number of filters needed in multiplexer module. And the number of the matching networks (MN) can be also reduced so that the multiplexer module can be simplified and minimized. The present disclosure proposes a reconfigurable filter that can reconfigure its pass-band and rejection-band frequency to function in multi-bands with a single filter.

Figure 2:
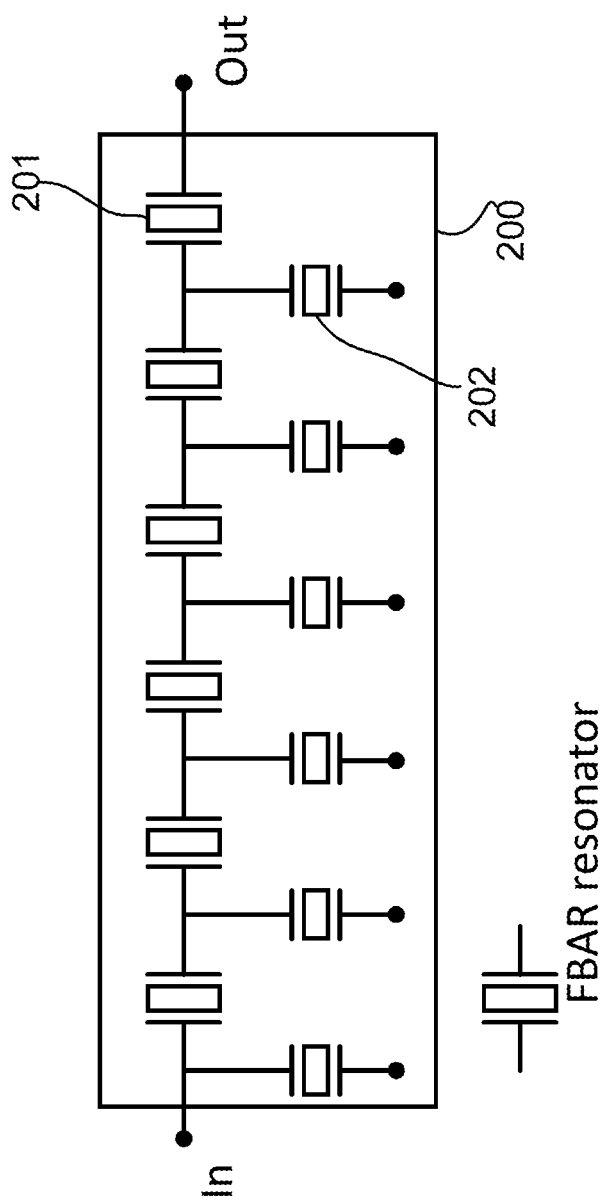
FIG. 2 is a simplified circuitry diagram of a conventional filter device for wireless communication system.

Film Bulk Acoustic Resonator (FBAR) technology has been used to make radio frequency (RF) filters for filtering RF signals in various wireless communication applications. FBAR resonators are typically made of a piezoelectric material sandwiched between two electrodes. When an alternating current is applied, the piezoelectric material resonates at a specific frequency, creating an acoustic wave. This resonance behavior can be used to pass or block certain frequencies in the RF spectrum. FBAR filters are particularly well-suited for high-frequency, low-loss, and narrow-bandwidth filtering requirements. FIG. 2 shows an example of a FBAR resonator-based filter device for wireless communication system. Optionally, the filter 200 is implemented along a transmission line, usually with a plurality of resonators in microstrip or coplanar waveguide (CPW), which guides the RF signal. For example, resonator 201 is one of the plurality of resonators coupled in series along the transmission line and resonator 202 is one of the plurality of resonators coupled in parallel (shunt) configuration relative to the transmission line. Here, the transmission line is a generally a specialized electrical circuit that facilitates the efficient transfer of electrical signals, typically in the form of voltage and current, from one point to another while maintaining signal integrity and minimizing losses. The filter 200 under this complex structure offers advantages in terms of steep roll-off characteristics, low insertion loss, and high selectivity. The resonators 201 in series are designed to resonate at the respective pass-band frequencies. They effectively "pass" the frequencies within the bandwidth of interest (pass-band) while providing high impedance to unwanted frequencies. The shunt resonators 202 create a low impedance path for undesired frequencies to ground, thereby attenuating them (rejection-band).

FBAR filters offer a high Quality (Q) factor, which means they provide a steep roll-off and better filter characteristics. This is ideal for applications that require tight channel separation. Due to the nature of acoustic wave propagation in FBAR, the devices can be much smaller than other filtering technologies, making them suitable for compact, portable devices. FBAR filters usually offer low insertion loss, meaning that very little signal power is lost when the signal passes through the filter. Additionally, FBAR technology can be designed to operate at very high frequencies, often well into the GHz range, making them suitable for a variety of modern wireless applications. Optionally, the RF filter may be made by other components that can replace FBAR (Film Bulk Acoustic Resonator) resonators, depending on the specific requirements such as frequency range, form factor, power handling, and Q-factor. These alternatives may include surface acoustic wave (SAW) resonators, bulk acoustic wave (BAW) resonators, ceramic resonators, Micro-Electro-Mechanical Systems (MEMS) resonators, LC resonators, crystal resonators, dielectric resonators, coaxial resonators, helical resonators. However, for the filter shown in FIG. 2, the pass-band and the rejection-band of the filter are fixed and not reconfigured as necessary.

Figure 3:
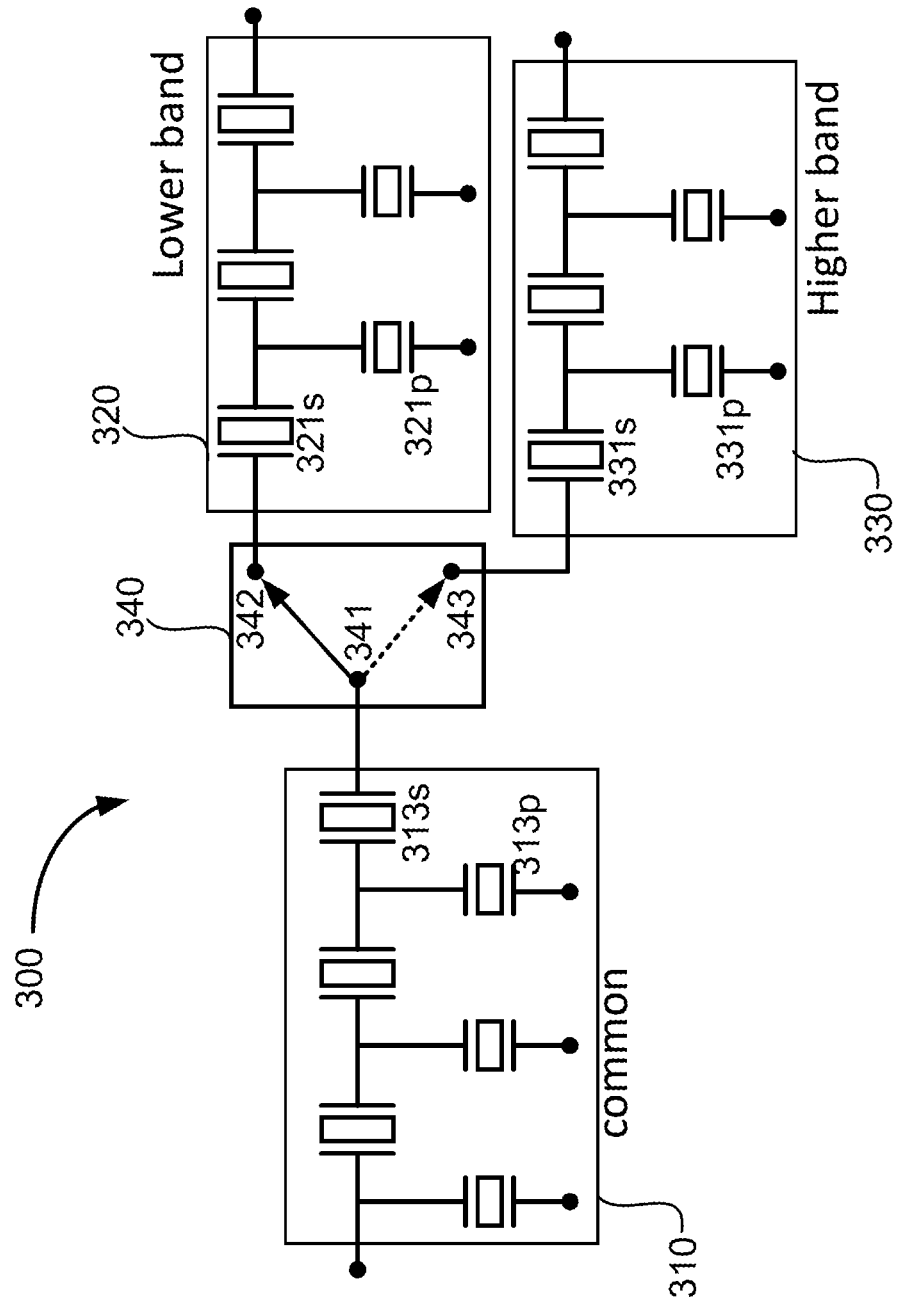
FIG. 3 is a simplified circuitry diagram of a reconfigurable filter for wireless communication system according to an embodiment of the subject technology.

FIG. 3 is a simplified circuitry diagram of a reconfigurable filter for wireless communication system according to an embodiment of the subject technology. This diagram is merely an example, which should not unduly limit the scope of the claims. One of ordinary skill in the art would recognize many variations, alternatives, and modifications. In an embodiment, the filter device 300 is divided by three circuits, first circuit 310, second circuit 320, and third circuit 330. Every circuit is inter-connected by a switch 340. The first circuit 310 is constructed by a plurality of first resonators 313s coupled in series in a transmission line and a plurality of second resonators 313p coupled in parallel with the transmission line. The first resonator 313s is a series resonator coupled in series in the transmission line. The second resonator 313p is a shunt resonator coupled in parallel to the transmission line. Based on the transmission spectra of these series or shunt resonators around their respective characteristic resonant frequency or anti-resonant frequency properly aligned, the first circuit 310 is configured to form a filter with a common pass-band and a common rejection-band for the wireless signals in certain frequency ranges.

Similarly, the second circuit 320 is constructed by a plurality of third resonators 321s coupled in series in a transmission line and a plurality of fourth resonators 321p coupled in parallel with the transmission line. The second circuit 320 can be configured to allow their respective anti-resonance frequencies or resonance frequencies being chosen properly so that the second circuit 320 can form a signal path with corresponding frequency response, i.e., forming a filter with desired pass-band and rejection bands. Alternatively, the third circuit 330 is constructed by a plurality of fifth resonators 331s coupled in series in a transmission line and a plurality of sixth resonators 331p coupled in parallel with the transmission line. The third circuit 330 can be configured to allow their respective anti-resonance frequencies or resonance frequencies being chosen properly so that the third circuit 330 can form an alternate signal path with corresponding frequency response, i.e., forming another filter with desired pass-band and rejection bands that are different from the filter based on the second circuit 320. In the same context of transmission responses around respective resonant frequencies or anti-resonant frequencies, the second circuit 320 and the third circuit 330 are configured to make the respective filters being reconfigurable respectively with a lower-frequency band and a higher-frequency band.

The switch 340 is configured to be a single pole double throw (SPDT) switch with a single input port 341 switchable to two output ports 342 and 343. The input port 341 is coupled to the first circuit 310. The output port 342 is coupled to the second circuit 320 and output port 343 is coupled to the third circuit 330. This is a kind of switch used to direct a high-frequency signal from one port to another among the two available but not to both simultaneously. The whole filter device 300, including the SPDT switch, can be used in opposite pathway, i.e., can be either in the receive path or transmit path of the multiplexer module. Using the switch 340, the first circuit 310 is either combined with the second circuit 320 to form a first filter or combined with the third circuit 330 to form a second filter, in which the first circuit 310 acts a common section and the second circuit 320 and the third circuit 330 act as tunning section. By properly choosing or aligning their respective anti-resonance or resonance frequencies, the first filter and the second filter can be configured to two different filters with different spectrum response in different frequency ranges. For example, the first filter may be configured to work at a lower-frequency range and the second filter may be configured to work at a higher-frequency range.

In an embodiment, the resonator in the circuits is provided as FBAR resonator. FBAR resonators are typically made of a piezoelectric material sandwiched between two electrodes. When an alternating current is applied, the piezoelectric material resonates at a specific frequency, creating an acoustic wave which is used for storing or transmitting radio frequency signals in the transmission line associated with the plurality of resonators in both series and shunt configurations. FBAR filters offer a high Quality (Q) factor, which means they provide a steep roll-off and better filter characteristics. This is ideal for applications that require tight channel separation. Due to the nature of acoustic wave propagation in FBAR, the devices can be much smaller than other filtering technologies, making them suitable for compact, portable devices. FBAR filters also offer many advantages like low insertion loss, adaptive to high or very high (well into GHz range) frequencies, and excellent temperature stability.

The resonator, or particularly the FBAR resonator, is characterized by a resonant frequency at which the resonator naturally oscillates and stores energy. At the resonant frequency, the impedance of the resonator is at a minimum, which allows for maximum energy storage or transmission. Also, the resonator is characterized by an anti-resonant frequency at which the resonator has maximum impedance and minimum energy storage. At the anti-resonant frequency, the resonator does not allow energy to be transmitted or stored effectively. When the resonators are coupled in series or shunt configurations, each series resonator is characterized by a resonance frequency $f_r$ at which the impedance of the resonator is at a minimum, which allows high transmission of signal power through the transmission line. The spectra response shows a sharp peak, leading to a formation of a pass-band. It is also associated with an anti-resonant frequency $f_n$ at which the impedance is at a maximum, allowing minimal transmission of power. The spectra response would show a trough or dip in power, leading to a formation of a rejection band. On the other hand, each shunt resonator is characterized by another resonant frequency $f_r'$ at which the impedance is at a maximum, effectively "blocking" the signal from being shunted away from the transmission line or keeping high transmission of power along the transmission line. The spectra response shows a peak, contributing to a pass-band. The shunt resonator also is characterized by another anti-resonant frequency $f_n'$ at which the impedance is at a minimum near zero, resulting in maximum power being shunted away from the transmission line. The spectra response would give a trough or dip in power, resulting in a rejection band. When the plurality of series and shunt resonators are coupled, like that in the first circuit 310, with their resonant frequencies and anti-resonant frequencies properly aligned, the respective spectra responses are aggregated to provide a desired pass-band with a certain bandwidth, a first rejection-band below a first rejection frequency at a relatively lower frequency range below the pass-band range, and a second rejection-band above a second rejection frequency at a relatively higher frequency range above the pass-band range.

Figure 4:
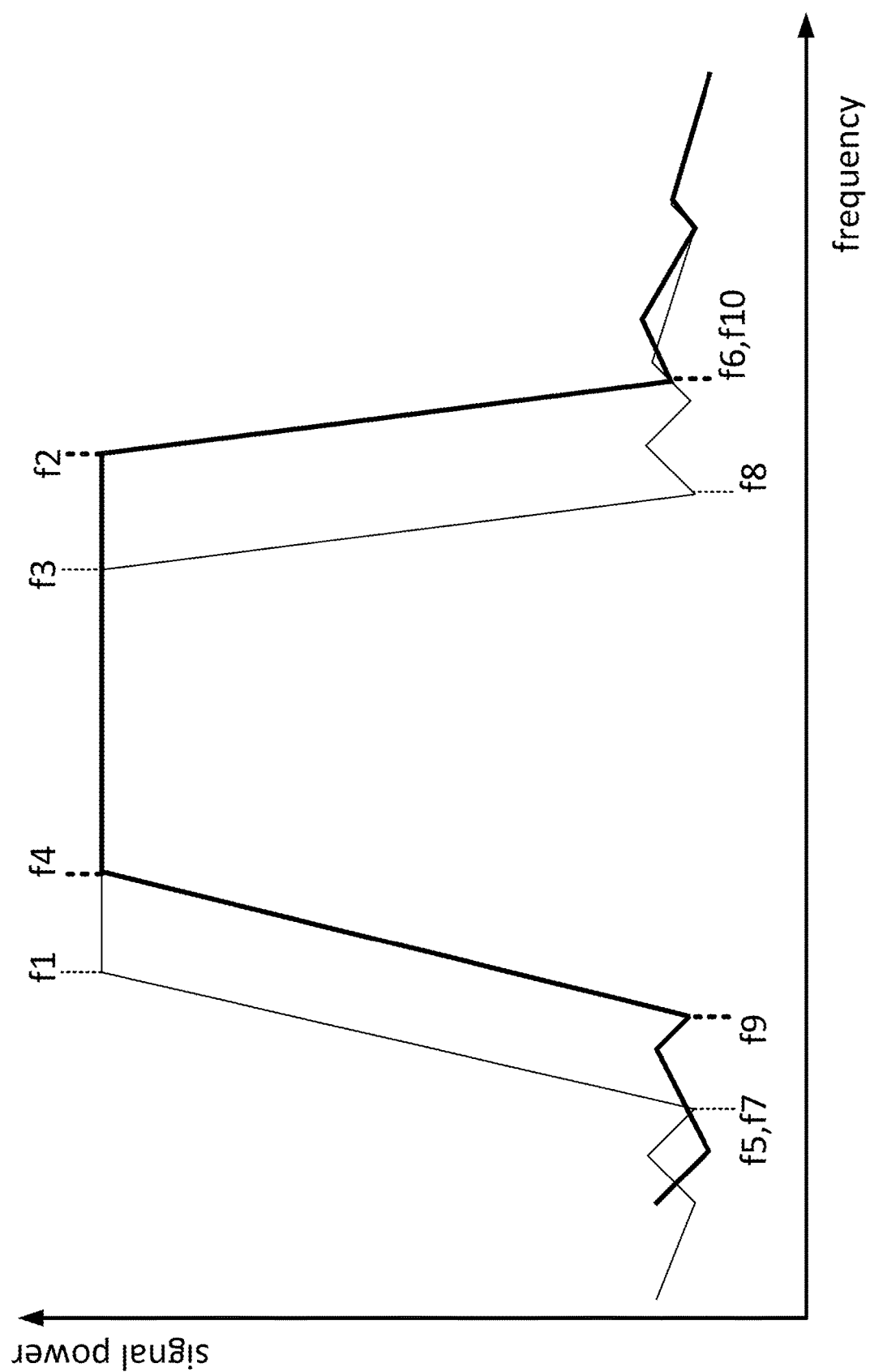
FIG. 4 is a schematic diagram of spectrum characteristics of the reconfigurable filter according to an embodiment of the subject technology.

FIG. 4 is a schematic diagram of spectrum characteristics of the reconfigurable filter of FIG. 3 according to an embodiment of the subject technology. This diagram is merely an example, which should not unduly limit the scope of the claims. One of ordinary skill in the art would recognize many variations, alternatives, and modifications. In an embodiment, the first circuit 310 by itself is configured to form a filter having a common pass-band from a first frequency $f_1$ to a second frequency $f_2$, $f_2 > f_1$. The second circuit 320, by itself, is configured to form a filter with a lower pass-band from a frequency no smaller than the first frequency $f_1$ to a third frequency $f_3 \leq f_2$. While, the third circuit 330, by itself, is configured to form a filter with a higher pass-band from a fourth frequency $f_4$ ($f_4 \geq f_1$) to a frequency no greater than the second frequency $f_2$. When the switch 340 is controlled to connect the first circuit 310 to the second circuit 320, their respective spectra are combined to form a first effective filter device configured with primarily the lower pass-band. While when the switch 340 is controlled to connect the first circuit 310 to the third circuit 330, their respective spectra are combined to form a second effective filter device reconfigured with primarily the higher pass-band. The first circuit 310 becomes a common section of both the first effective filter and the second effective filter.

From an alternative viewing angle, the first effective filter and the second effective filter can be distinguished by focusing to their respective rejection bands, which automatically determine their respective pass-bands and the rejection loss from the pass-band frequency crossing to the rejection band frequency. In the embodiment, the first circuit is configured to have a first rejection-band below a fifth frequency $f_5$ and a second rejection-band above a sixth frequency $f_6$. The first effective filter (combined the first circuit and the second circuit) has a third rejection-band below a seventh frequency $f_7$ which is aligned to the fifth frequency $f_5$ and a fourth rejection band above an eighth frequency $f_8$. The second effective filter (combined the first circuit and the third circuit) has a fifth rejection-band below a ninth frequency $f_9$ and a sixth rejection-band above a tenth frequency $f_{10}$ which is aligned to the sixth frequency $f_6$. By making proper design choices on the number of series or shunt resonators as well as their respective spectra responses around their resonant frequency and anti-resonant frequency, the fifth frequency can be made smaller than the first frequency, $f_5 < f_1$, the sixth frequency can be made greater than the second frequency, $f_6 > f_2$, giving a gap from the first pass-band to the first and second rejection-band. Particularly, the spectra roll-off characteristic and steepness of the power drop can be controlled in a small frequency gap with enhanced quality factor. Similarly, the eighth frequency $f_8$ is larger than the third frequency $f_3$ and the ninth frequency $f_9$ is smaller than the fourth frequency $f_4$. Additionally, the seventh frequency $f_7$ may be aligned to the fifth frequency $f_5$ and the tenth frequency $f_{10}$ may be aligned to the sixth frequency $f_6$ to make the respective spectra roll-off even steeper. In an implementation, the reconfigurable filter 300 can be, as needed, configured to be lower band filter or a higher band filter. Optionally, 5 or greater number of resonators can be selected for either the series resonators or shunt resonators to achieve >40 dB isolation between the pass-band and the rejection-band. In other words, the third (or fifth) rejection-band is deeper in rejection than the first rejection-band, the fourth (or sixth) rejection-band is deeper in rejection than the second rejection-band.

In a specific embodiment, the first effective filter may be configured to have a narrower fourth pass-band from an eleventh frequency to a twelfth frequency, a seventh rejection-band below a thirteenth frequency, and an eighth rejection-band above a fourteenth frequency. The eleventh frequency is higher than the first frequency and the twelfth frequency is lower than the second frequency, i.e., the fourth pass-band is basically a part within the first pass-band. The thirteenth frequency for the seventh rejection-band is higher than the fifth frequency. But the seventh rejection-band is deeper in rejection than the first rejection-band attributed to combined effect of the first filter and the second filter. The fourteenth frequency for the eighth rejection-band is lower than the sixth frequency. But the eighth rejection-band is deeper in rejection than the second rejection-band.

Figure 5:
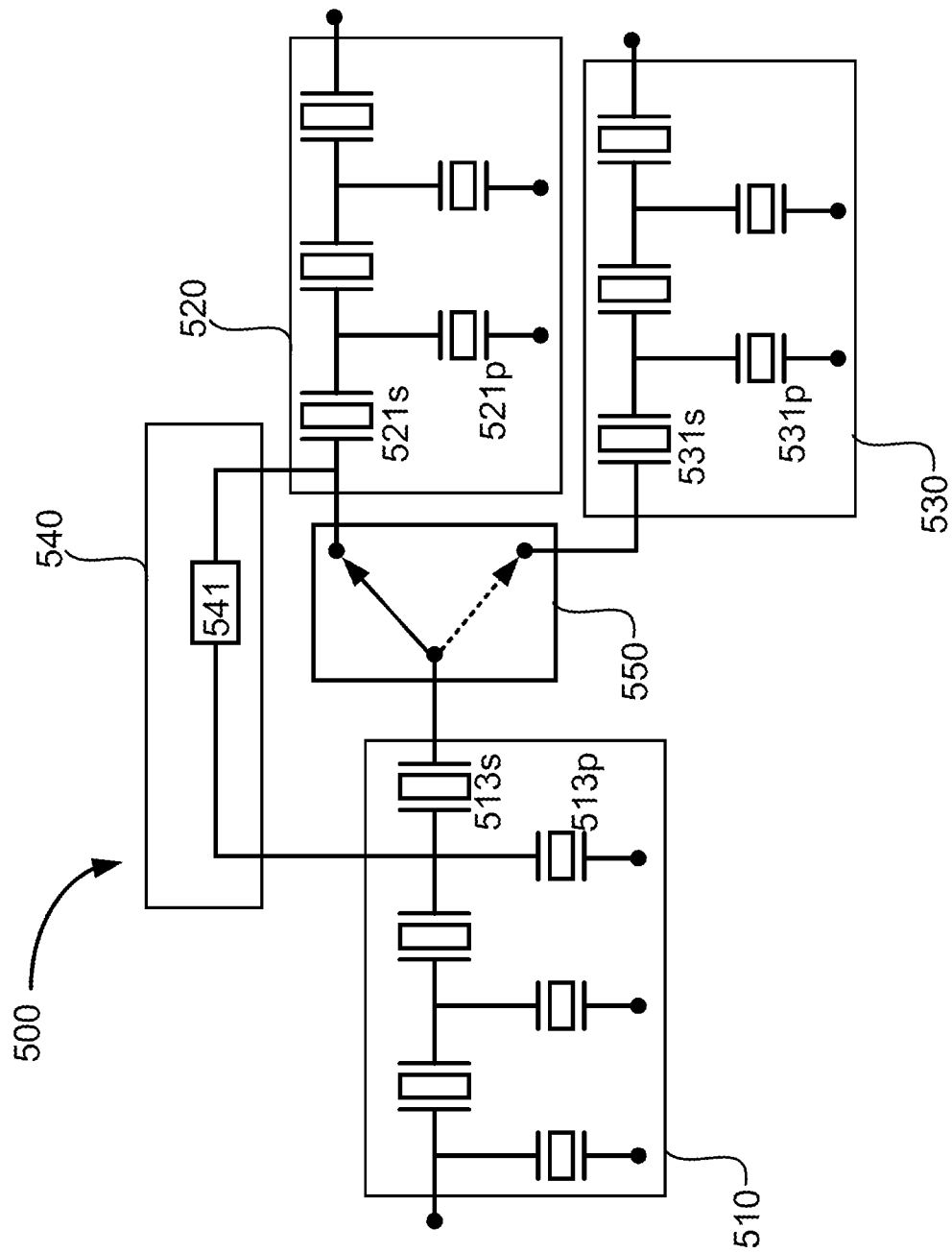
FIG. 5 is a simplified circuitry diagram of a reconfigurable filter for wireless communication system according to another embodiment of the subject technology.

FIG. 5 is a simplified circuitry diagram of a reconfigurable filter for wireless communication system according to another embodiment of the subject technology. This diagram is merely an example, which should not unduly limit the scope of the claims. One of ordinary skill in the art would recognize many variations, alternatives, and modifications. In another embodiment, the reconfigurable filter device 500 includes a first circuit 510, a second circuit 520, and a third circuit 530 respectively being configured as a first filter with a common pass-band and common rejection-band, a second filter with a lower pass-band, and a third filter with a higher pass-band. Each of the first, second, and third circuits may be constructed by a (artificial) transmission line assembled by a plurality of resonators in both series and shunt configurations. Optionally, the resonator is a FBAR resonator characterized by one or more resonant frequencies and anti-resonant frequencies to express certain spectra responses either in peaks or in troughs. The combined effect of the plurality of resonators in series and shunt configurations leads to certain pass-band and rejection-band at certain frequency ranges of interest.

The reconfigurable filter device 500 also includes a switch 550 configured to either connect the first circuit 510 to the second circuit 520 for reconfiguring a first filter with the lower pass-band or connect the first circuit 510 to the third circuit 530 for reconfiguring a second filter with the higher pass-band. Furthermore, the reconfigurable filter device 500 includes a fourth circuit 540 coupled between the first circuit 510 and the second circuit 520 in parallel to the connection between them established by the switch 550 from an input port to a first output port. With the fourth circuit, the first filter now becomes a first effective filter. Optionally, the fourth circuit 540 includes a capacitor 541. Optionally, the fourth circuit 540 includes a resonator 541. Optionally, the capacitor 541 has one terminal coupled to a common terminal of a last series resonator 513$s$ and a last shunt resonator 513$p$ of the first circuit 510. The first terminal of the first series resonator 531$s$ in the third circuit 530 is coupled to the second output port of the switch 550. The second terminal of the first series resonator 531$s$ is coupled to a terminal of the first shunt resonator 531$p$ of the third circuit 530. The capacitor 541 has another terminal coupled to a first terminal of a first series resonator 521$s$ of the second circuit 520. The first terminal of a first series resonator 521$s$ of the second circuit 520 is coupled to the first output port of the switch 550. The second terminal of the first series resonator 521$s$ of the second circuit 520 is coupled to a first terminal of a first shunt resonator 521$p$ of the second circuit 520.

Figure 6:
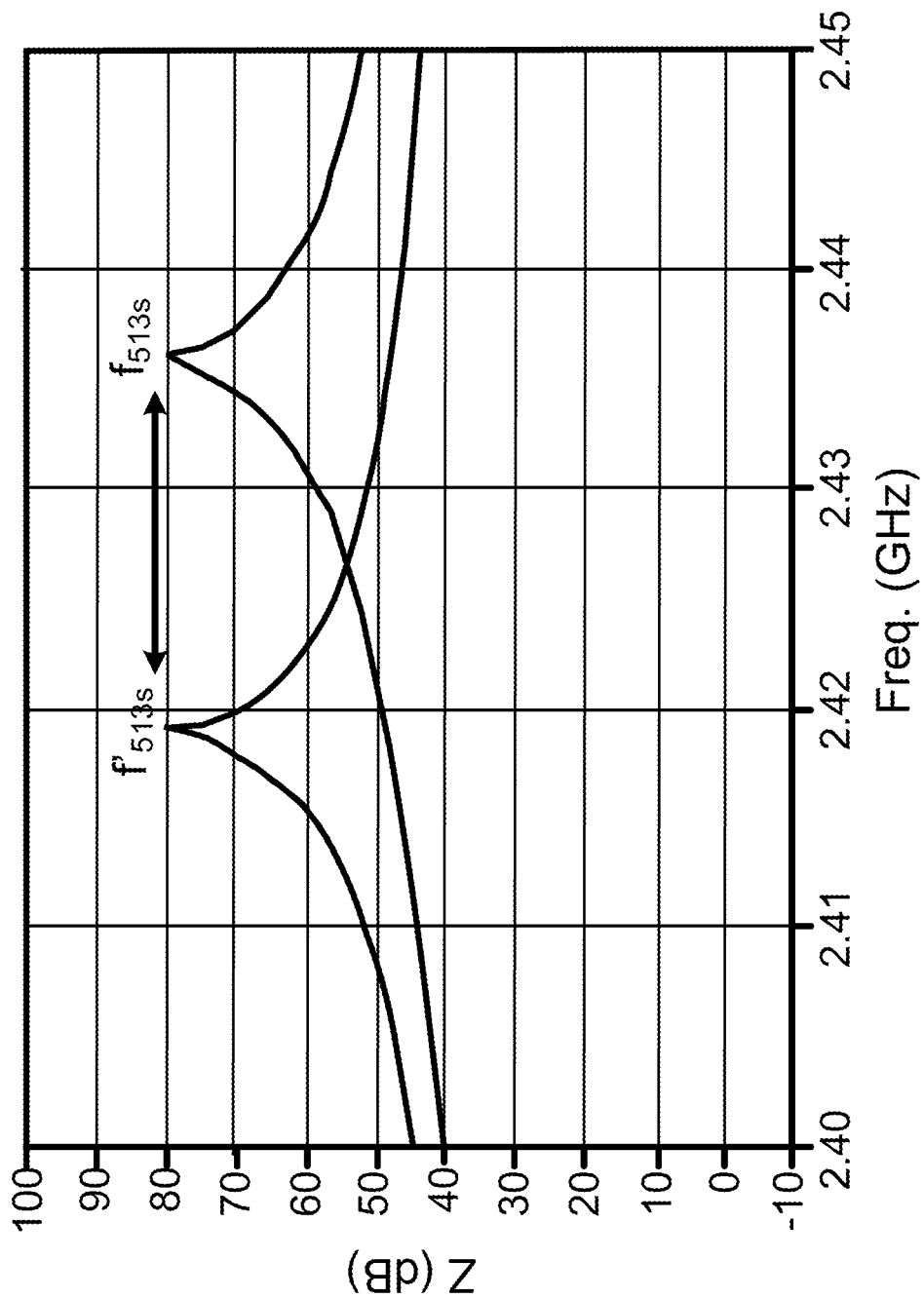
FIG. 6 is a simplified plot showing the anti-resonance frequency being tuned by an added circuit according to an embodiment of the subject technology.

The fourth circuit 540, with the capacitor 541, is configured to cause a reduction of down-shift of a maximum impedance value at a lower anti-resonant frequency of the last series resonator 513$s$ in the first circuit 510. In this case, the first circuit and the second circuit are combined with the fourth circuit to form a new first effective filter with some changes in the fourth rejection band. The second filter remains the same (as a second effective filter). Correspondingly, the spectra trough response occurs at a slightly different frequency, or the new first effective filter has a deeper rejection band being enhanced with a steeper rejection loss at the frequencies slightly greater than the band edge frequency. Adding the fourth circuit 540 provides an additional reconfigurable scheme for the first effective filter. FIG. 6 is a simplified plot showing the anti-resonance frequency being tuned by an added circuit according to an embodiment of the subject technology. As shown in FIG. 6, the peak impedance of about 80 dB for the last series resonator 513$s$ of the first circuit 510 corresponds to an anti-resonant frequency, which is shifted down from $f_{513s}$ (~2.436 GHZ) to $f'_{513s}$ (~2.419 GHz). The downshift of the peak response in impedance is equivalent to the downshift of a trough response in power transmission. Because of this change in the spectrum response, the fourth rejection-band of the new first effective filter may have a steeper rejection loss for frequencies slightly above the rejection band edge $f_6$, enhancing the quality factor of the first effective filter. Optionally, the fourth circuit 540 may include a resonator.

In an alternative embodiment, the fourth circuit 540, comprising an inductor or a resonator, may be configured to be coupled between the last series resonator 513s in the first circuit 510 and the first series resonator 531s in the third circuit 530. Essentially it adds additional signal path for the last series resonator 513s to provide a lower impedance to change the spectrum response. As a result, the anti-resonance frequency of the last series resonator 513s in the first circuit 510 is shifted slightly higher. This shift may effectively cause a steeper rejection loss at frequencies slightly above the band edge $f_{10}$ the sixth rejection band of a new second effective filter (that is combined with the first circuit 510, the third circuit 530, and the fourth circuit 540), enhancing the performance of the reconfigurable filter.

In a specific embodiment, the first effective filter is characterized by a fourth pass-band that is configured to be narrower than the first pass-band (or a part within the first pass-band). The first effective filter is also characterized by a seventh rejection-band below an eleventh frequency that is higher than the fifth frequency. But, the combined effect of the first circuit, the second circuit, and the fourth circuit provides the seventh rejection deeper in rejection than the first rejection band. Additionally, the first effective filter may be characterized by an eighth rejection-band above twelfth frequency that is lower than the sixth frequency. But the eighth rejection-band is deeper in rejection than the second rejection-band.

Figure 7:
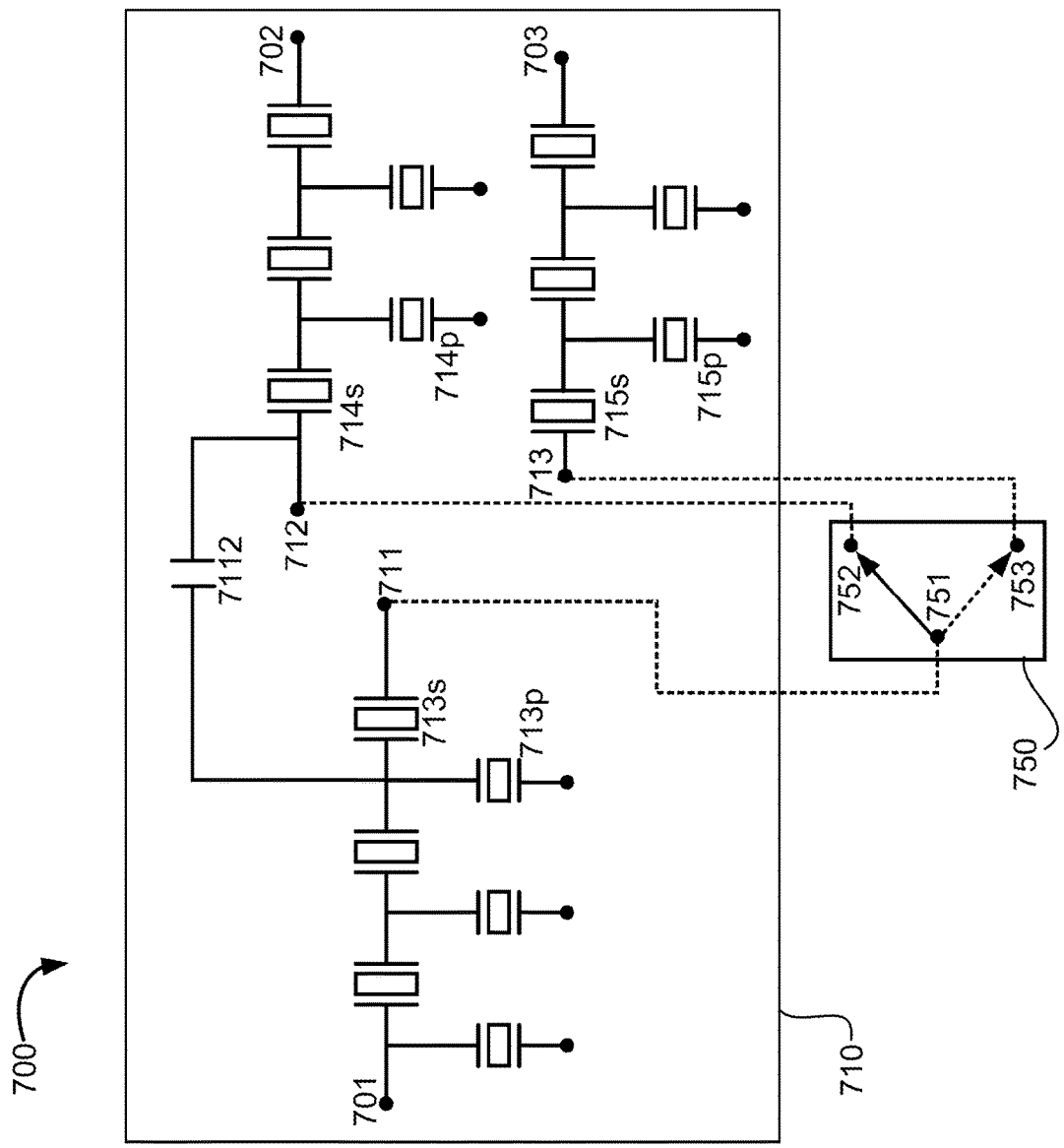
FIG. 7 is a simplified circuitry diagram of a reconfigurable filter for wireless communication system according to yet another embodiment of the subject technology.

FIG. 7 is a simplified circuitry diagram of a reconfigurable filter for wireless communication system according to yet another embodiment of the subject technology. This diagram is merely an example, which should not unduly limit the scope of the claims. One of ordinary skill in the art would recognize many variations, alternatives, and modifications. In the alternative embodiment, a reconfigurable filter device 700 includes a circuit 710 comprising a first plurality of resonators in series and shunt circuitry from port 701 to port 711 characterized by a first pass-band from a first frequency to a second frequency. The resonator in series circuitry is represented by series resonator 713s and the resonator in shunt circuitry is represented by shunt resonator 713p. The circuit 710 also includes a second plurality of resonators in series and shunt circuitry, represented by series resonator 714s and shunt resonator 714p, from port 712 to port 702 characterized by a second pass-band from the first frequency to a third frequency. The circuit 710 further includes a third plurality of resonators in series and shunt circuitry, represented by series resonator 715s and shunt resonator 715p, from port 713 to port 703 characterized by a third pass-band from a fourth frequency to the second frequency. Furthermore, the circuit 710 includes a capacitor 7112 coupled between the first plurality of resonators and the second plurality of resonators. With proper selections of the series resonators and shunt resonators, the third frequency can be configured to be lower than the second frequency but higher than the first frequency. The fourth frequency can be configured to be higher than the first frequency but lower than the second frequency. The circuit 710 may be provided as an individual chip die by integrating all the resonators and capacitor inside one chip and with each of those ports, 701, 711, 712, 702, 713, and 703 as a surface contact.

Additionally, the reconfigurable filter device 700 includes a switch 750 with an input port 751 and a first output port 752 and a second output port 753. The switch 750 is controlled to connect the input port 751 either to the first output port 752 or to the second output port 753. The input port 751 may be coupled to the port 711 to connect with the first plurality of resonators in series and shunt circuitry. The first output port 752 is coupled to port 712 to connect with the second plurality of resonators in series and shunt circuitry. The second output port 753 is coupled to port 713 to connect the third plurality of resonators in series and shunt circuitry. When the switch 750 is controlled to connect the input port 751 to the first input port 752, the reconfigurable filter device 700 is configured to be a first filter with the second pass-band with additional rejection in corresponding rejection-bands. When the switch 750 is controlled to connect the input port 751 to the second input port 752, the reconfigurable filter device 700 is reconfigured to be a second filter with the third pass-band with additional rejection in corresponding rejection-bands.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. A filter device for multi-band wireless communication comprising:
   a first circuit characterized by a first pass-band from a first frequency to a second frequency, the second frequency being greater than the first frequency;
   a second circuit characterized by a second pass-band from a frequency no smaller than the first frequency to a third frequency, the third frequency being no higher than the second frequency but higher than the first frequency;
   a third circuit characterized by a third pass-band from a fourth frequency to a frequency no greater than the second frequency, the fourth frequency being no smaller than the first frequency but smaller than the second frequency; and
   a switch being configured to connect the first circuit either to the second circuit to reconfigure a first filter with the second pass-band or to the third circuit to reconfigure a second filter with the third pass-band, wherein at least one of the second pass-band and the third pass-band is narrower than the first pass-band.

2. The device of claim 1 wherein the first circuit comprises a first rejection-band below a fifth frequency and a second rejection-band above a sixth frequency, the fifth frequency being smaller than the first frequency, the sixth frequency being higher than the second frequency.

3. The device of claim 2 wherein the first filter comprises a third rejection-band below a seventh frequency and a fourth rejection-band above an eighth frequency, the seventh frequency being aligned with the fifth frequency, the eighth frequency being greater than the third frequency but smaller than the sixth frequency.

4. The device of claim 2 wherein the second filter comprises a fifth rejection-band below a ninth frequency and a sixth rejection-band above a tenth frequency, the ninth frequency being smaller than the fourth frequency but greater than the fifth frequency, the tenth frequency being aligned with the sixth frequency.

5. The device of claim 3 wherein the first circuit comprises a plurality of first resonators coupled in series in a transmission line and a plurality of second resonators coupled in parallel with the transmission line, each first resonator being characterized by a respective anti-resonance frequency associated with the sixth frequency, each second resonator being characterized by a respective resonance frequency associated with the fifth frequency.

6. The device of claim 5 wherein each of the first resonator and the second resonator comprises a film bulk acoustic resonator (FBAR).

7. The device of claim 5 wherein the second circuit comprises a plurality of third resonators coupled in series in a transmission line and a plurality of fourth resonators coupled in parallel with the transmission line, each third resonator being characterized by a respective anti-resonance frequency associated with the eighth frequency, each fourth resonator being characterized by a respective resonance frequency associated with the seventh frequency, each of the third resonator and the fourth resonator comprising a film bulk acoustic resonator (FBAR).

8. The device of claim 7 wherein the third rejection band comprises at least 40 dB loss for frequencies smaller than the seventh frequency, attributed to an aggregation of each peak impedance contribution from each fourth resonator and second resonator at the respective resonance frequency with the seventh frequency being aligned to the fifth frequency.

9. The device of claim 7 wherein the fourth rejection-band comprises at least 40 dB loss for frequencies greater than the eighth frequency, attributed to an aggregation of each peak impedance contribution from each third resonator and first resonator at the respective anti-resonance frequency.

10. The device of claim 4 wherein the third circuit comprises a plurality of fifth resonators coupled in series in a transmission line and a plurality of sixth resonators coupled in parallel with the transmission line, each fifth resonator being characterized by a respective anti-resonance frequency associated with the tenth frequency, each sixth resonator being characterized by a respective resonance frequency associated with the ninth frequency, each of the fifth resonator and the sixth resonator comprising a film bulk acoustic resonator (FBAR).

11. The device of claim 10 wherein the fifth rejection-band comprises at least 40 dB loss for frequencies smaller than the ninth frequency, attributed to an aggregation of each peak impedance contribution from each sixth resonator and second resonator at the respective resonance frequency.

12. The device of claim 11 wherein the sixth rejection-band comprises at least 40 dB loss for frequencies greater than the tenth frequency, attributed to an aggregation of each peak impedance distribution of each fifth resonator and first resonator at the respective anti-resonance frequency with the tenth frequency being aligned to the sixth frequency.

13. The device of claim 3 wherein the first filter comprises a fourth pass-band from an eleventh frequency to a twelfth frequency, a seventh rejection-band below a thirteenth frequency, and an eighth rejection-band above a fourteenth frequency, the eleventh frequency being higher than the first frequency, the twelfth frequency being lower than the second frequency, the thirteenth frequency being higher than the fifth frequency but the seventh rejection-band being deeper in rejection than the first rejection-band, the fourteenth frequency being lower than the sixth frequency but the eighth rejection-band being deeper in rejection than the second rejection-band.

14. A reconfigurable filter device comprising:
a first circuit characterized by a first pass-band from a first frequency to a second frequency, the second frequency being higher than the first frequency;
a second circuit characterized by a second pass-band from a frequency no smaller than the first frequency to a third frequency, the third frequency being no higher than the second frequency but higher than the first frequency;
a third circuit characterized by a third pass-band from a fourth frequency to a frequency no greater than the second frequency, the fourth frequency being no lower than the first frequency but lower than the second frequency;
a switch comprising an input port coupled to the first circuit, a first output coupled to the second circuit, and a second output port coupled to the third circuit, the switch being configured to receive a first signal filtered with the first pass-band through the first circuit at the input port and deliver to the first output port for reconfiguring a second signal filtered with the second pass-band through the second circuit, or directly to the second output port for reconfiguring a third signal filtered with the third pass-band through the third circuit; and
a fourth circuit coupled in parallel to the switch between the first circuit and the second circuit or the third circuit and configured to enforce rejection-bands for the second signal or the third signal.

15. The device of claim 14 wherein the first circuit comprises a plurality of first resonators coupled in series in a transmission line and a plurality of second resonators coupled in parallel with the transmission line, the plurality of second resonators resulting in a first rejection-band below a fifth frequency, the plurality of first resonators resulting in a second rejection-band above a sixth frequency, the fifth frequency being lower than the first frequency, the sixth frequency being higher than the second frequency.

16. The device of claim 15 wherein the second circuit comprises a plurality of third resonators coupled in series in a transmission line and a plurality of fourth resonators coupled in parallel with the transmission line, the second circuit combined with the first circuit producing a first filter with the second pass-band, the plurality of fourth resonators and the plurality of second resonators providing the first filter with a third rejection-band with higher loss than the first rejection-band below a seventh frequency, the plurality of third resonators and the plurality of first resonators providing the first filter with a fourth rejection-band with higher loss than the second rejection-band above an eighth frequency, the seventh frequency being aligned with the fifth frequency, the eighth frequency being higher than the third frequency.

17. The device of claim 16 wherein the third circuit comprises a plurality of fifth resonators coupled in series in a transmission line and a plurality of sixth resonators coupled in parallel with the transmission line, the third circuit combined with the first circuit producing a second filter with the third pass-band, the plurality of sixth resonators and the plurality of second resonators providing the second filter with a fifth rejection-band with higher loss than the first rejection band below a ninth frequency, the plurality of fifth resonators and the plurality of first resonators providing the second filter with a sixth rejection-band with higher loss than the second rejection-band above a tenth frequency, the ninth frequency being lower than the fourth frequency, the tenth frequency being aligned with the sixth frequency.

18. The device of claim 17 wherein the fourth circuit comprises a capacitor, or an inductor, or a resonator configured to reconfigure the first or second filter with increased rejection loss by shifting the anti-resonance frequency of one of the first resonators in the first circuit.

19. The device of claim 16 wherein the first filter is alternatively characterized by a fourth pass-band that is configured to be narrower than and within the first pass-band, a seventh rejection-band below an eleventh frequency that is higher than the fifth frequency, and an eighth rejection-band above twelfth frequency that is lower than the sixth frequency, the seventh rejection-band being deeper in rejection than the first rejection-band, the eighth rejection-band being deeper in rejection than the second rejection-band.

20. A reconfigurable filter device comprising:
a circuit comprising a first plurality of resonators in series and shunt circuitry characterized by a first pass-band from a first frequency to a second frequency, a second plurality of resonators in series and shunt circuitry characterized by a second pass-band from a frequency no smaller than the first frequency to a third frequency, a third plurality of resonators in series and shunt circuitry characterized by a third pass-band from a fourth frequency to a frequency no greater than the second frequency, and a capacitor coupled between the first plurality of resonators and the second plurality of resonators, the third frequency being lower than the second frequency but higher than the first frequency, the fourth frequency being higher than the first frequency but lower than the second frequency; and
a switch configured to couple to the circuit to either connect the first plurality of resonators to the second plurality of resonators to reconfigure a first filter with the second pass-band and deeper rejection-bands or connect the first plurality of resonators to the third plurality of resonators to reconfigure a second filter with the third pass-band and deeper rejection-bands.

* * * * *